United States Patent
Singh (10) Patent No.: US 9,418,993 B2
(45) Date of Patent: Aug. 16, 2016

(54) DEVICE AND METHOD FOR A LDMOS DESIGN FOR A FINFET INTEGRATED CIRCUIT

(71) Applicant: GLOBALFOUNDRIES Inc., Grand Cayman (KY)

(72) Inventor: Jagar Singh, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 102 days.

(21) Appl. No.: 13/958,938

(22) Filed: Aug. 5, 2013

(65) Prior Publication Data
US 2015/0035053 A1 Feb. 5, 2015

(51) Int. Cl.
| | |
|---|---|
| *H01L 27/088* | (2006.01) |
| *H01L 21/8234* | (2006.01) |
| *H01L 29/40* | (2006.01) |
| *H01L 29/78* | (2006.01) |
| *H01L 29/06* | (2006.01) |

(52) U.S. Cl.
CPC .... *H01L 27/0886* (2013.01); *H01L 21/823431* (2013.01); *H01L 29/402* (2013.01); *H01L 29/404* (2013.01); *H01L 29/7835* (2013.01); *H01L 29/0653* (2013.01)

(58) Field of Classification Search
CPC ............ H01L 29/7835; H01L 29/1095; H01L 29/0847; H01L 29/0696; H01L 29/42368; H01L 29/6659; H01L 29/66659; H01L 29/1083; H01L 27/11; H01L 27/1104; H01L 21/823807; H01L 27/0207; H01L 29/4238; H01L 27/0886; H01L 29/402; H01L 29/404; H01L 21/823431; H01L 29/0653
See application file for complete search history.

(56) References Cited

U.S. PATENT DOCUMENTS

| | | | | |
|---|---|---|---|---|
| 8,598,670 | B2* | 12/2013 | Ito | H01L 29/0865 257/408 |
| 2002/0011633 | A1* | 1/2002 | Kumagai | 257/393 |
| 2004/0094806 | A1* | 5/2004 | Schillaci et al. | 257/401 |
| 2008/0248623 | A1* | 10/2008 | Tsai et al. | 438/276 |

OTHER PUBLICATIONS

A. Nezer, C. A. T Salama, "Breakdown voltage in LDMOS transistors using internal field rings", IEEE Transactions on Electron Devices, Jul. 1991, pp. 1676-1680, vol. 38, Issue 7, IEEE Electron Devices Society.

\* cited by examiner

*Primary Examiner* — Michelle Mandala
(74) *Attorney, Agent, or Firm* — Heslin Rothenberg Farley & Mesiti P.C.; Jacquelyn Graff (57) ABSTRACT

Semiconductor devices and methods for manufacturing an LDMOS FinFET integrated circuit. The intermediate semiconductor device includes a substrate, a first well in the substrate, a second well in the substrate, and at least two polysilicon gates. The first well overlaps the second well and the at least one first gate is disposed over the first well and at least one second gate is disposed over the second well. The method includes forming a channel region and a drift region in the substrate, wherein the channel region overlaps the drift region, forming a shallow trench isolation region in the drift region, forming at least one first gate over the channel region, forming at least one second gate over the shallow trench isolation region, and applying at least one metal layer over the at least one first gate and the at least one second gate.

8 Claims, 9 Drawing Sheets

DEVICE AND METHOD FOR A LDMOS DESIGN FOR A FINFET INTEGRATED CIRCUIT

FIELD OF THE INVENTION

The present invention relates to semiconductor devices and methods of fabricating semiconductor devices, and more particularly, to methods and processes for creating a LDMOS design for a FinFET integrated circuit.

BACKGROUND OF THE INVENTION

Semiconductor devices or integrated circuits (IC) may include various voltage level devices, such as, for example, low, intermediate and high power devices. The high power devices may be used for output high-voltage (HV) interface stages, such devices may be, for example, cell phones, base station markets, analog to digital and complementary metal-oxide-semiconductor (CMOS) circuit interfaces, power management, industrial, scientific, and medical market applications, and others. One commonly used HV component for high power devices is the laterally diffused metal oxide semiconductor (LDMOS) device. In general LDMOS device have longer poly silicon length compared to core CMOS devices. To fabricate the LDMOS require process capability enablement at longer PC length, which is LDMOS specific extra efforts. Therefore, a LDMOS enablement with smaller PC length similar core CMOS is preferred.

The fabrication of smaller PC gate length LDMOS transistors can be problematic for existing LDMOS designs with the currently available fabrication techniques. Further, LDMOS transistors with smaller polysilicon gate lengths using currently available LDMOS designs fail to maintain the desired characteristics, such as, breakdown voltage, and leakage current etc.

BRIEF SUMMARY

The shortcomings of the prior art are overcome and additional advantages are provided through the provision, in one aspect, an intermediate semiconductor device, includes, for instance: a substrate, a first well in the substrate, a second well in the substrate and overlapping the first well, and at least two polysilicon gates with at least one first gate disposed over the first well and at least one second gate disposed over the second well.

In another aspect, a method is presented which includes, for instance: forming a channel region and a drift region in a substrate with the channel region overlapping the drift region, forming a shallow trench isolation region in the drift region, forming at least one first gate over the channel region, forming at least one second gate over the shallow trench isolation region, and applying at least one metal layer over the at least one first gate and the at least one second gate.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

The present disclosure addresses and enhances, inter alia, the design and fabrication of FinFETs for LDMOS devices with shorter gate lengths. As the size of the gates decreases, the turn-on-resistance ($R_{on}$) of the drift and channel regions as well as other parameters of the devices must be optimized. In addition, the manufacturing process must be optimized to increase the ease of manufacturing as the size of the gate lengths continues to be made smaller.

Generally stated, disclosed herein are certain novel portions of intermediate laterally diffused metal oxide semiconductors (LDMOS) for FinFET integrated circuits and methods of manufacturing LDMOS devices, which provide advantages over the above noted, existing LDMOS devices. Advantageously, the multiple gates of the LDMOS disclosed herein may improve the functioning of the electrical circuits of the LDMOS devices. The multiple gates and methods of fabrication may also allow for LDMOS devices with low specific turn-on-resistance ($R_{on,sp}$), high breakdown voltage (BV), and low gate-drain overlap capacitance ($C_{gd}$).

Figure 1:
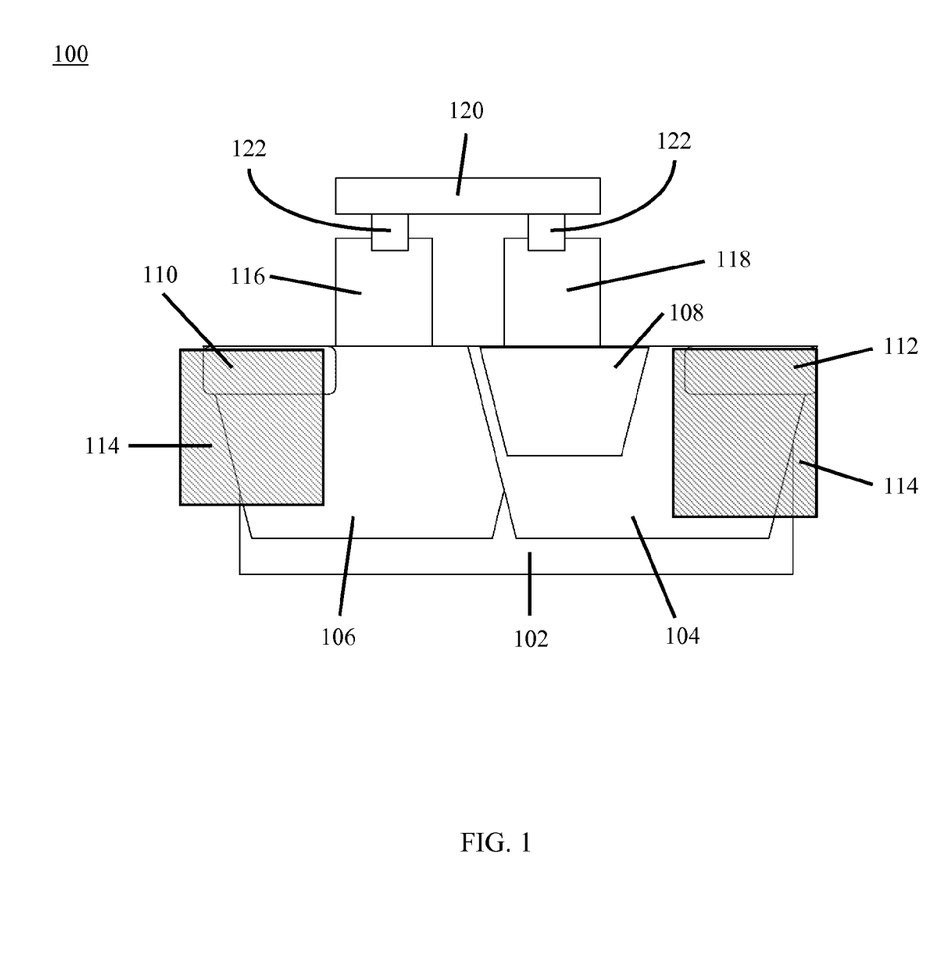
FIG. 1 depicts a cross-section of one embodiment of a portion of an intermediate semiconductor device, in accordance with one or more aspects of the present invention.
Figure 2:
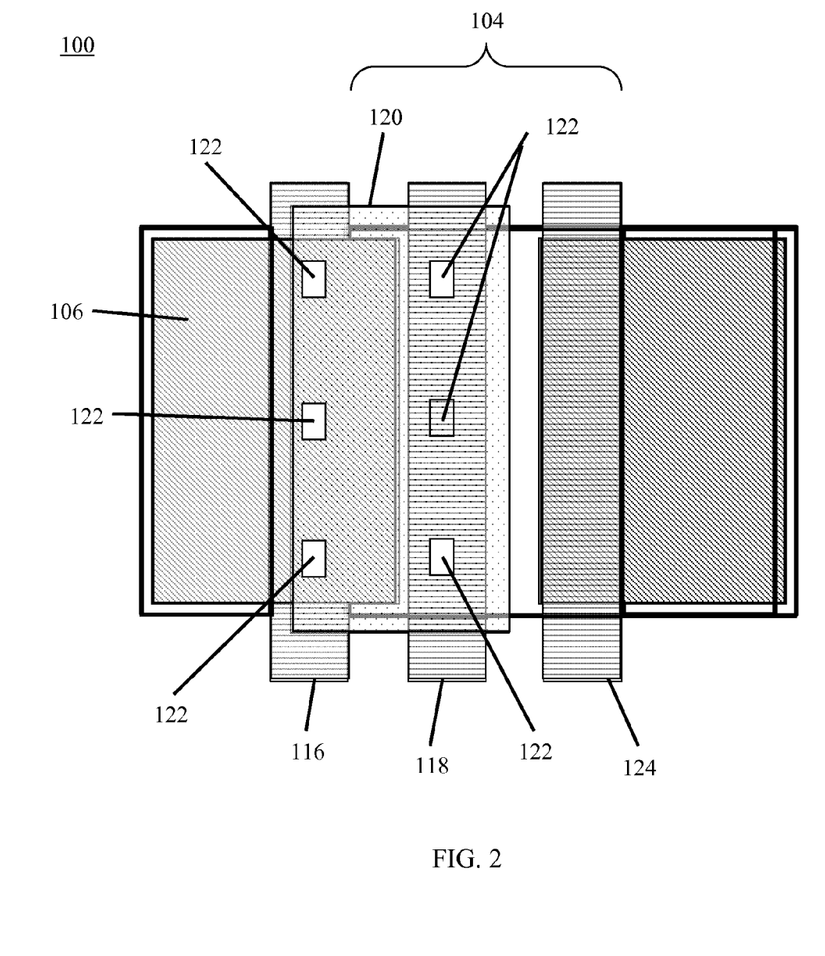
FIG. 2 depicts a top layout view of the portion of the intermediate semiconductor device of FIG. 1, in accordance with one or more aspects of the present invention.
Figure 3:
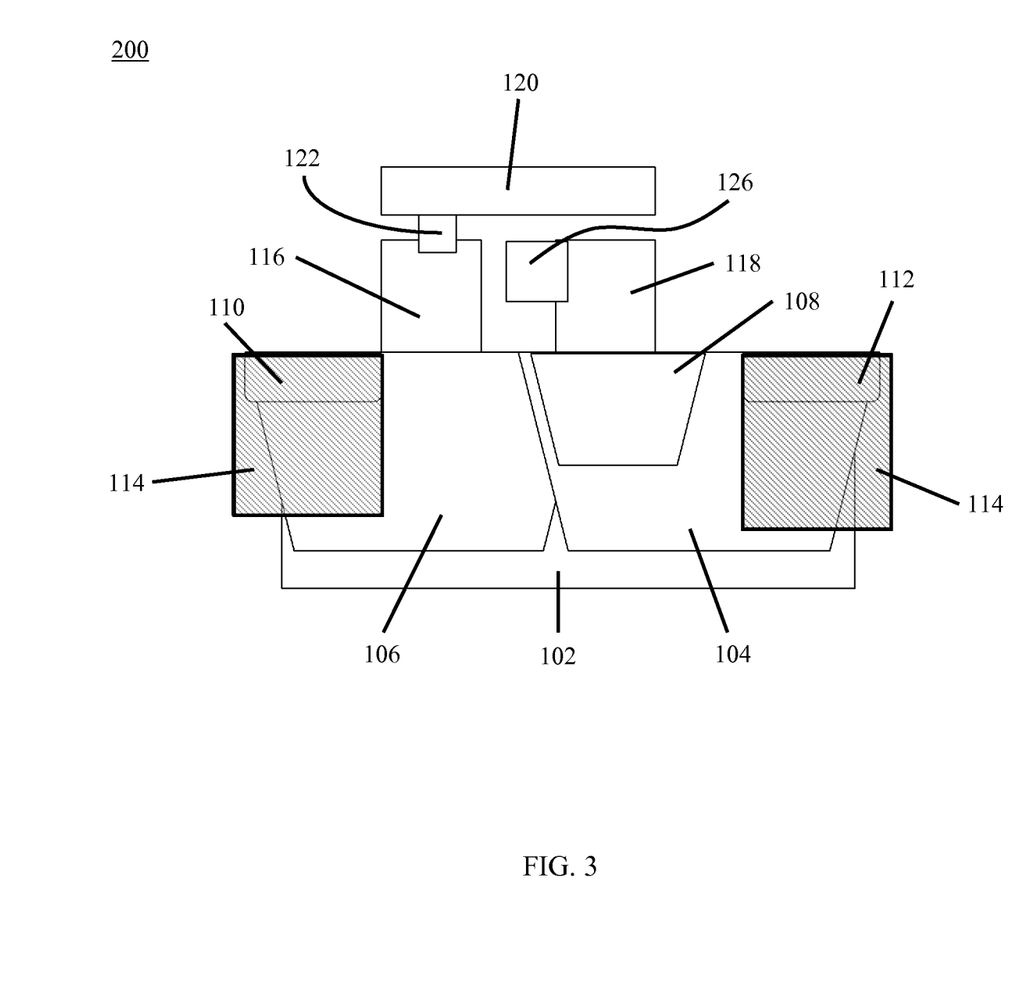
FIG. 3 depicts a cross-section of another embodiment of a portion of an intermediate semiconductor device, in accordance with one or more aspects of the present invention.
Figure 4:
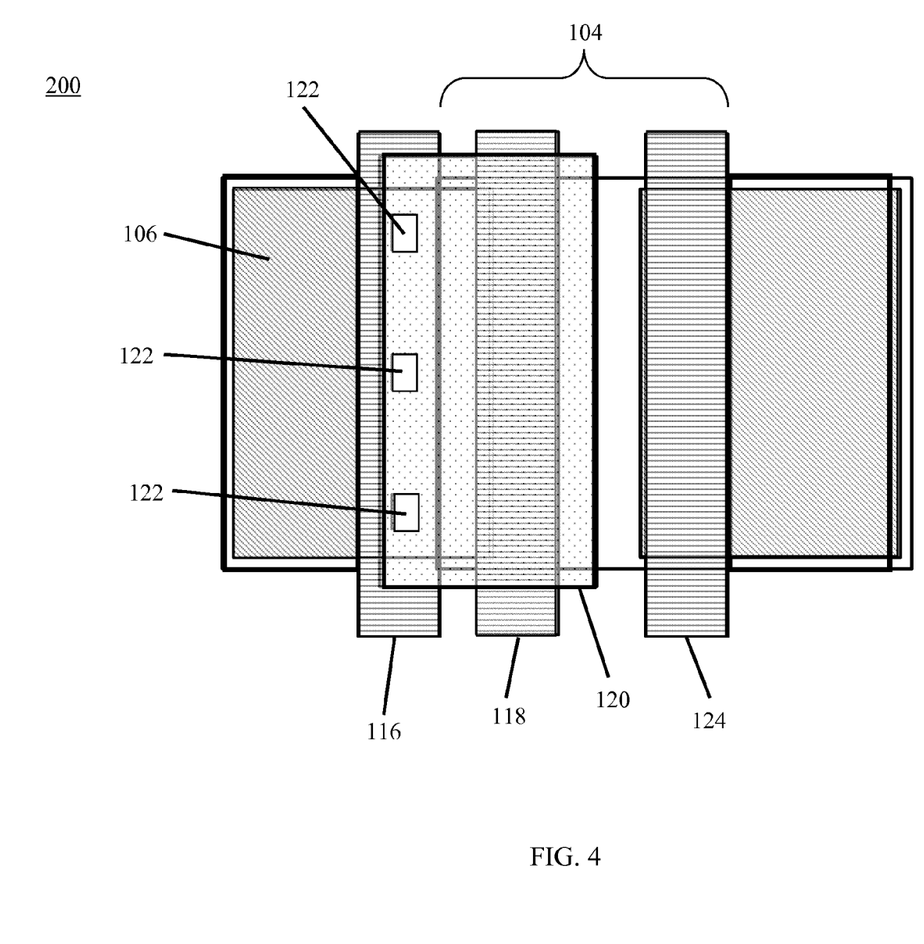
FIG. 4 depicts a top layout view of the portion of the intermediate semiconductor device of FIG. 3, in accordance with one or more aspects of the present invention.
Figure 5:
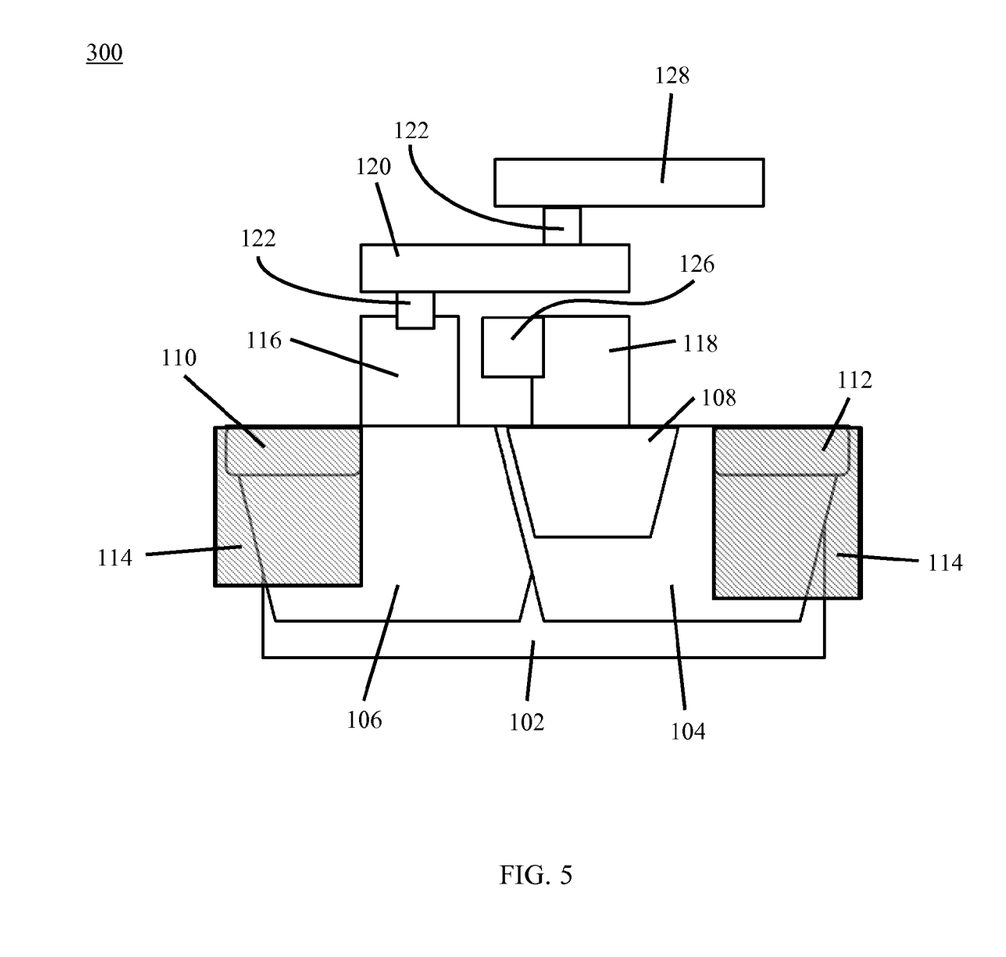
FIG. 5 depicts a cross-section of the portion of the intermediate semiconductor device of FIG. 3 with a second metal layer, in accordance with one or more aspects of the present invention.
Figure 6:
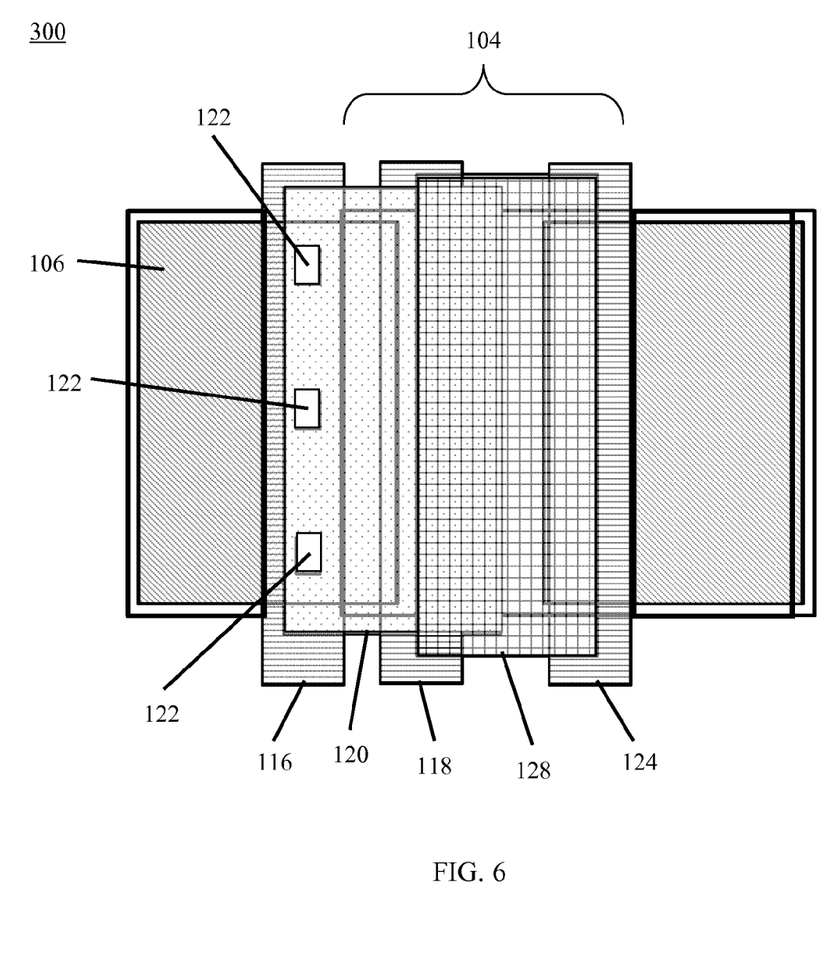
FIG. 6 depicts a top layout view of the portion of the intermediate semiconductor device of FIG. 5, in accordance with one or more aspects of the present invention.

In one aspect, in one embodiment, FIGS. 1-8 show portions of semiconductor devices 100, 200, and 300, in accordance with one or more aspects of the present invention, during an early stage of fabrication. The semiconductor device 100 is shown in FIGS. 1 and 2. The semiconductor device 200 is shown in FIGS. 3-4 and 7-8. The semiconductor device 300 is shown in FIGS. 5 and 6. The devices 100, 200, and 300 may include a substrate 102 with a drift region 104 and a channel region 106. The devices 100, 200, and 300 may also include a shallow trench isolation (STI) region 108, a source region 110, and a drain region 112. The source region 110 and the drain region 112 may be made with or without an epitaxial growth process. The source region 110 may overlap with the channel region 106 and the drain region 112 may overlap with the drift region 104. The devices 100, 200, and 300 may also include at least one implant 114, for example, a first implant 114 may be aligned over the source region 110 and a second implant 114 may be aligned over the drain region 112. The implants 114 may be used to reduce the source and drain resistance. In the depicted embodiments, the implants 114 may be N-implants or P implants. The devices 100, 200, and 300 may also include at least one first gate 116 fabricated over the channel region 106 and at least one second gate 118 fabricated over the drift region 104. The at least one first and second gates 116, 118 may be polysilicon gates. The at least one first gate 116 may be separated from the at least one second gate 118 and the separation between the gates 116, 118 may be used to control the reduced surface field (RESURF) action. The at least one first gate 116 may control the channel 106, while the at least one second gate 118 may control the electric field, i.e., the RESURF.

As shown in FIGS. 1 and 2, the device 100 may have at least one metal layer 120 connected to the at least one first gate 116 and the at least one second gate 118 using contacts 122. The metal layer 120 may also be configured to assist with the RESURF action as described in greater detail below. In the present embodiment the metal layer 120 and the at least one gate 124 may act as RESURF (or shield) plates to obtain the desired characteristics of the device 100 [1]. The separation between the at least one first gate 116 and the at least one second gate 118 and the width of the gates 116, 118 may be optimized in order to achieve the desired $R_{on}$ and breakdown voltage.

As is understood in the art, LDMOS transistors have comparatively high breakdown voltages (BV), allowing them to support other electrical devices that operate at high voltages. Breakdown voltage is the voltage level at which an uncontrollable increase in current through the LDMOS transistor occurs. As the semiconductor device fabrication transitions to 20 nanometers and below, LDMOS transistors with reduced turn-on-resistance ($R_{on}$) and enhanced circuit performance are needed. However, the reduced turn-on-resistance may lead to a reduction of breakdown voltage, which in turn degrades the performance of LDMOS transistors in high-voltage applications. Thus, there currently exists a trade-off between the breakdown voltage and the turn-on-resistance of the LDMOS transistors. However, the reduced surface field (RESURF) design technique seeks to reduce peak electric fields to improve breakdown voltage, and provide better trade-off between breakdown voltage (BV) and specific turn-on-resistance ($R_{on,sp}$) as compared to conventional semiconductor devices. Note that the RESURF design technique is affected by a variety of factors such as, for example, doping of the lateral depletion layer, and the BV of conventional semiconductor devices is limited by factors such as, for example, buried oxide thickness, fin thickness and the drift layer length.

As illustrated in FIGS. 3 and 4, an embodiment of a portion of the semiconductor device 200 may have at least one metal layer 120 connected to the at least one first gate 116. The at least one second gate 118 may not be connected to the metal layer 120 and may be left floating on the unused area of the device 200. Floating gates, such as, the at least one second gate 118, may be placed on the device 200, but not connected to the metal layer 120 in order to increase the gate density of the device 200. In devices with at least one second gate 118, the metal layer 120 may act as a RESURF for the device 200 allowing for control of the gate charge. The gate charge may be calculated from the gate-drain overlap capacitance and the turn-on-resistance. When the at least one second gate 118 is not connected to the metal layer 120, the device 200 may include an implant 126 connected to the at least one second gate 118. In addition, the implants 114 may be optimized for specific doping profiles, for example, the implants 114 may be doped to create a specific anode and a specific cathode for the source 110 and drain 112.

In FIGS. 5 and 6, an embodiment of a portion of the semiconductor device 300 is shown. The device 300 may include a metal layer 120 connected to the at least one first gate 116 as described above with reference to FIGS. 3 and 4. The device 300 may also have an implant 126 of the type described above with reference to FIGS. 3 and 4, which is connected to the at least one second gate 118. In addition, the device 300 may include a second metal layer 128 connected to the first metal layer 120 by a contact 122. As illustrated in FIGS. 5 and 6, the first and second metal layers 120, 128 may only be connected to the at least one first gate 116. The first and second metal layers 120, 128 may act as a RESURF for the device 300 to control the gate charge of the device 300. Based on the voltage requirement of the circuit design for the device 300, the first and/or second metal layers 120, 128 may also be connected to the at least one second gate 118.

Figure 7:
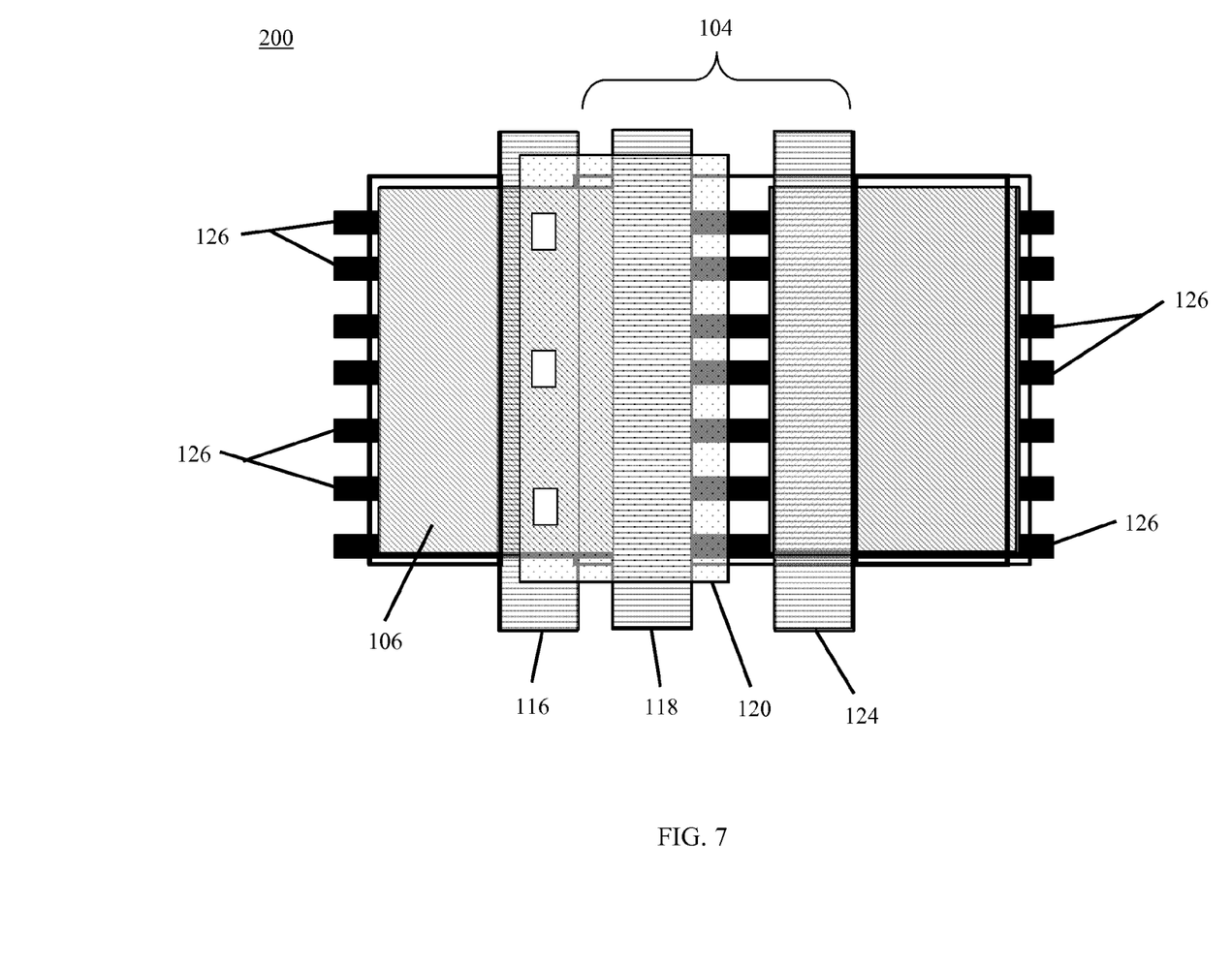
FIG. 7 depicts the top layout view of the portion of the intermediate semiconductor device of FIG. 4 showing the fins, in accordance with one or more aspects of the present invention.
Figure 8:
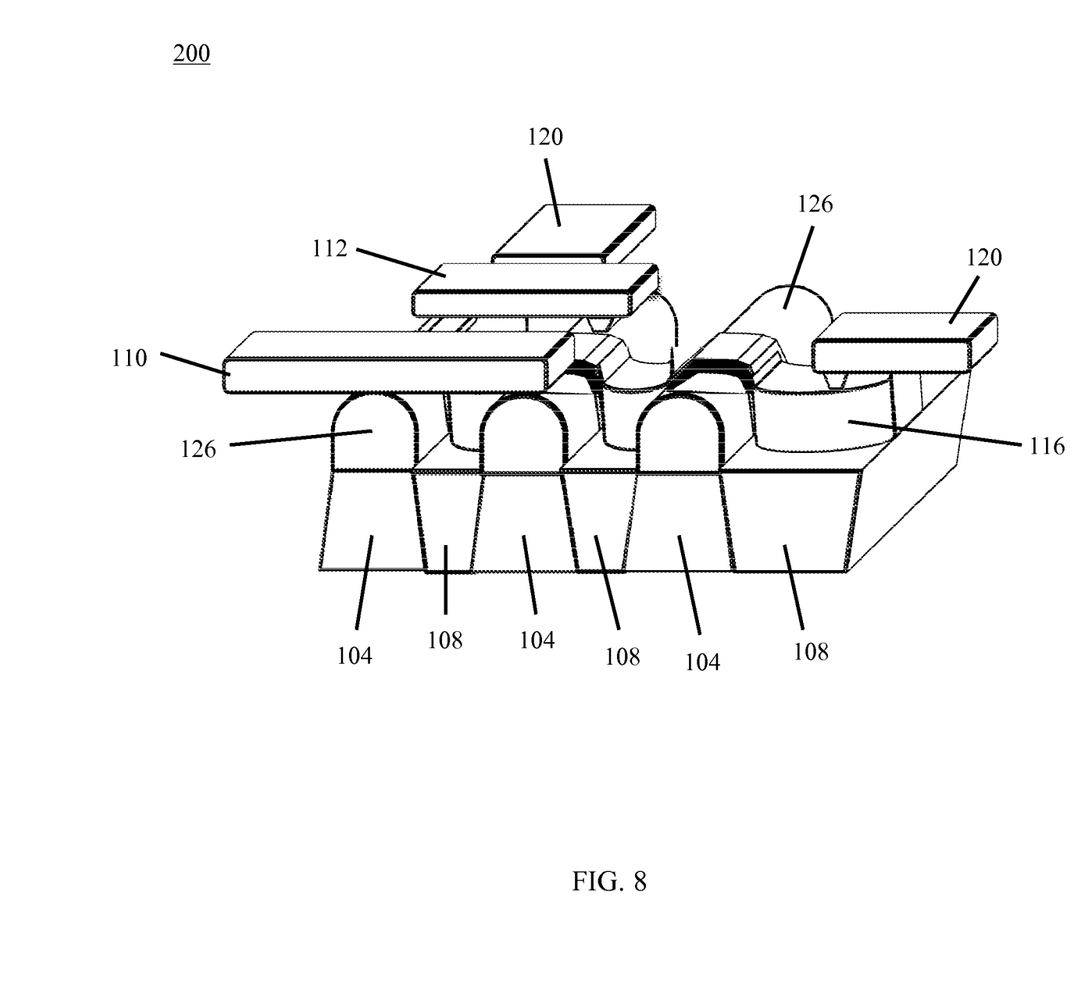
FIG. 8 depicts a perspective view of the intermediate semiconductor device of FIG. 3, in accordance with one or more aspects of the present invention.

As shown in FIGS. 7 and 8, the device 200 may also include at least one fin 126. The at least one fin 126 may be parallel and perpendicular to the gates 116, 118, and 124. The devices 100 and 300 may also include at least on fin 126 as shown in FIGS. 7 and 8.

By way of specific example, devices 100, 200, and 300 may be FinFET devices having polysilicon gates 116, 118 with lengths of, for example, 0.24 µm or smaller. As described in greater detail above, the devices 100, 200 and 300 may include multiple gates 116 and multiple gates 118. The multiple gates 116, 118 are smaller gates for the devices 100, 200 and 300 which will add up to the total gate length of the devices 100, 200 and 300. The number of gates 116 and gates 118 will be based on the channel length of the device 100, 200 and 300. For LDMOS devices needing higher voltages, the total polysilicon gate length may be increased proportionally to the increase in voltage.

Figure 9:
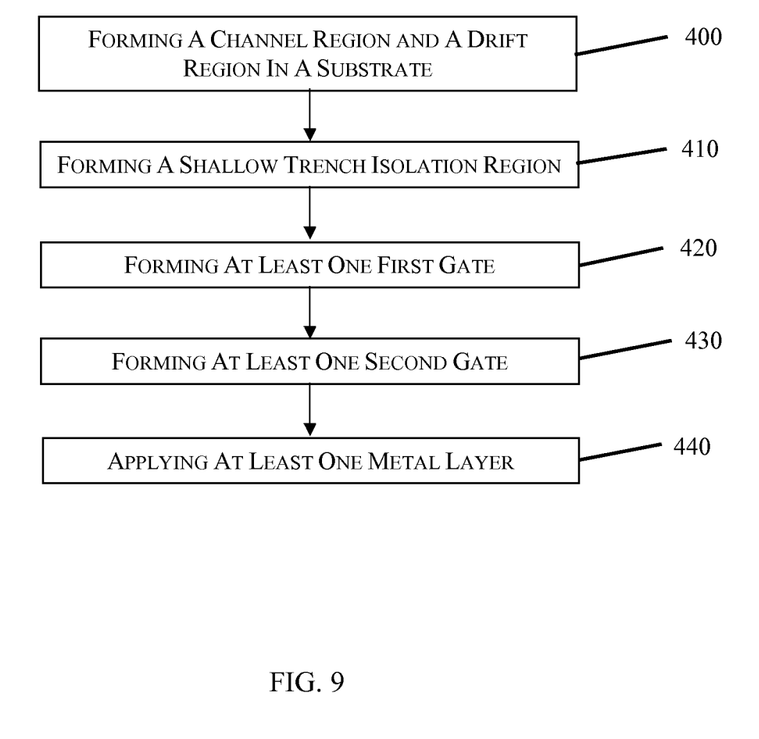
FIG. 9 depicts a process of splitting the polysilicon gate to create LDMOS designs for a FinFET integrated circuit, in accordance with one or more aspects of the present invention.

As shown in FIG. 9, a method of forming multiple polysilicon gates for an LDMOS FinFET integrated circuit, such as devices 100, 200 and 300, is shown. During fabrication, a substrate or wafer will be processed through numerous fabrication processes to create the LDMOS device. The method may include forming a channel region and a drift region in a substrate with the channel region overlapping the drift region 400. The method may also include forming a shallow trench isolation region in the drift region 410. In addition, the method may include forming at least one first gate over the channel region 420 and forming at least one second gate over the shallow trench isolation region 430. The method may further include applying at least one metal layer over the at least one first gate and the at least one second gate 440.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An intermediate semiconductor device, comprising:
    a substrate;
    a first well extending into the substrate;
    a second well extending into the substrate, wherein the first well overlaps the second well;
    a shallow trench isolation region extending into a first portion of the second well;
    a first region extending below a top surface of the first well such that at least a portion thereof overlaps the first well, wherein the first region is selected from a source region and a drain region;
    a second region extending below a top surface of a second portion of the second well such that at least a portion thereof overlaps the second well, wherein the second region is selected from a source region and a drain region, and wherein the first and second portions of the second well are spaced from each other such that a portion of the second well extends between the shallow trench isolation region and the second region;
    at least one first implant disposed within the device such that a portion thereof is aligned with the first region to selectively reduce a resistance of the first region;
    at least one second implant disposed within the device such that a portion thereof is aligned with the second region to selectively reduce a resistance of the second region; and
    at least two polysilicon gates, wherein at least one first gate is disposed on the first well and at least one second gate is disposed on the second well.

2. The device of claim 1, wherein the first implant is composed of an N type material and the second implant is composed of an N type material.

3. The device of claim 1, further comprising:
    at least one metal layer, wherein the at least one metal layer is disposed over and connects the at least one first gate and the at least one second gate.

4. The device of claim 1, further comprising:
    at least one metal layer, wherein the at least one metal layer is disposed over the at least one first gate and the at least one second gate and the at least one metal layer connects to the at least one first gate.

5. The device of claim 4, further comprising:
    at least one implant, wherein the at least one implant is connected to the at least one second gate.

6. The device of claim 5, wherein the at least one metal layer comprises:
    a first metal layer connected to the at least one first gate; and
    a second metal layer connected to the first metal layer.

7. The device of claim 1, wherein the first region is a source region, the second region is a drain region, the at least one first implant is composed of an N type material, and the at least one second implant is composed of an N type material.

8. The device of claim 1, wherein the first region is a drain region, the second region is a source region, the at least one first implant is composed of an N type material, and the at least one second implant is composed of an N type material.

* * * * *